(12) United States Patent
Claeys et al.

(10) Patent No.: US 8,773,118 B2
(45) Date of Patent: Jul. 8, 2014

(54) MAGNETOMETER

(75) Inventors: Michael Christian Maximilian Claeys, Sea Point (ZA); Eric Wilhelmus Josephus Van Steen, Pinelands (ZA); Jacobus Lucas Visagie, Sasolburg (ZA); Jan van de Loosdrecht, Sasolburg (ZA)

(73) Assignee: University of Cape Town, Cape Town (ZA)

( * ) Notice: Subject to any disclaimer, the term of this patent is extended or adjusted under 35 U.S.C. 154(b) by 641 days.

(21) Appl. No.: 13/003,109

(22) PCT Filed: Jul. 10, 2009

(86) PCT No.: PCT/IB2009/006210
§ 371 (c)(1),
(2), (4) Date: Apr. 29, 2011

(87) PCT Pub. No.: WO2010/004419
PCT Pub. Date: Jan. 14, 2010

(65) Prior Publication Data
US 2011/0204884 A1    Aug. 25, 2011

(30) Foreign Application Priority Data
Jul. 11, 2008  (ZA) .................................. 2008/06085

(51) Int. Cl.
*G01R 33/02* (2006.01)
*G01R 33/12* (2006.01)
*G01R 33/16* (2006.01)
*C07C 27/00* (2006.01)
*B01D 50/00* (2006.01)

(52) U.S. Cl.
USPC ........... 324/244; 324/233; 324/234; 324/201; 518/700; 518/704; 518/706; 422/177

(58) Field of Classification Search
CPC .................................................... G01R 33/1215
USPC .......................................................... 324/244
See application file for complete search history.

(56) References Cited

U.S. PATENT DOCUMENTS 2,946,948 A * 7/1960 Foner ............................ 324/233
3,496,459 A * 2/1970 Foner ............................ 324/233

(Continued)

FOREIGN PATENT DOCUMENTS

GB 2438838 A * 12/2007
JP 5-172922 A 7/1993

(Continued)

OTHER PUBLICATIONS

P.A. Chernayskii, A.Y. Khodakov, G.V. Pankina, J.S. Girardon, E. Quinet, In situ characterization of the genesis of cobalt metal particles in silica-supported Fischer-Tropsch catalysts using Foner magnetic method, Applied Catalysis A: General 306 (2006) 108-119.*

(Continued)

*Primary Examiner* — Jermele M Hollington
*Assistant Examiner* — Christpher McAndrew
(74) *Attorney, Agent, or Firm* — Leydig, Voit & Mayer, Ltd.

(57) ABSTRACT

A magnetometer which includes an elongate reactor in which a sample can be secured in a sample support zone and which is located within a magnetic field space of a magnetic field generator and one or more signal pickup coils. Movement generating means is provided for generating relative movement in a generally linear direction between the reactor and at least one of the magnetic field and pickup coil, preferably by moving the reactor in its length. The magnetometer is characterised in that the reactor is a metal tube having a length which permits its ends to remain external of the signal pickup device during the relative movement.

11 Claims, 2 Drawing Sheets

(56) References Cited

U.S. PATENT DOCUMENTS

| | | | |
|---|---|---|---|
| 4,050,013 A * | 9/1977 | Maddox | 324/234 |
| 4,073,750 A * | 2/1978 | Yates et al. | 502/259 |
| 5,311,125 A * | 5/1994 | Krause et al. | 324/201 |
| 5,506,500 A * | 4/1996 | Krause et al. | 324/201 |
| 5,600,241 A * | 2/1997 | Jacobsen et al. | 324/228 |
| 5,817,702 A * | 10/1998 | Behrmann et al. | 518/700 |
| 6,110,979 A * | 8/2000 | Nataraj et al. | 518/704 |
| 6,593,377 B1 * | 7/2003 | Harford et al. | 518/706 |
| 6,929,758 B2 * | 8/2005 | Oda et al. | 252/62.63 |
| 7,001,574 B2 * | 2/2006 | Harford et al. | 422/177 |
| 7,183,768 B2 * | 2/2007 | Min | 324/260 |
| 7,524,787 B2 * | 4/2009 | Visagie et al. | 502/53 |
| 2003/0031624 A1 * | 2/2003 | Schummer et al. | 423/651 |
| 2004/0152791 A1 * | 8/2004 | Zyl et al. | 518/720 |
| 2005/0218891 A1 * | 10/2005 | Viola | 324/244 |
| 2006/0060776 A1 * | 3/2006 | Punnoose | 250/309 |
| 2009/0133473 A1 * | 5/2009 | Punnoose | 73/31.05 |
| 2010/0277164 A1 * | 11/2010 | Tilbrook et al. | 324/244 |
| 2013/0076343 A1 * | 3/2013 | Carpenter et al. | 324/202 |

FOREIGN PATENT DOCUMENTS

| | | | |
|---|---|---|---|
| JP | 2007141482 A * | 6/2007 | |
| SU | 473971 A | 10/1975 | |
| SU | 1277757 A1 | 10/1991 | |
| WO | WO 2007/141482 A1 | 12/2007 | |

OTHER PUBLICATIONS

S. Foner and E. J. McNiff, Jr., Very Low Frequency Integrating Vibrating Sample Magnetometer (VLFVSM) with High Differential Sensitivity in High dc Fields, The Review of Scientific Instruments vol. 39, No. 2 Feb. 1968 pp. 171-179.*

* cited by examiner

MAGNETOMETER

CROSS REFERENCE TO PRIOR APPLICATION

This is a U.S. national phase application under 35 U.S.C. §371 of International Patent Application No. PCT/IB2009/006210, filed Jul. 10, 2009, and claims benefit of South African Patent Application No. 2008/06085, filed Jul. 11, 2008, which is incorporated by reference herein. The International Application was published in English on Jan. 14, 2010 as WO 2010/004419 A2 under PCT Article 21(2).

FIELD OF THE INVENTION

This invention relates to a magnetometer for use in analysing samples, more particularly, but not exclusively, for analysing catalyst samples under operating conditions.

BACKGROUND TO THE INVENTION

In-situ characterisation of catalysts has become increasingly important. It is however not easy to measure or monitor physical or chemical changes in a working catalyst. The reasons for this are that the catalyst is inside a reactor and therefore not visible and neither can it be removed or sampled without interfering with the reaction. It is therefore necessary to find some property of the catalyst that can be measured without disturbing or interfering with the reaction. This property also needs to be able to provide the necessary information about the catalyst. The magnetic properties of the sample of interest fulfil these requirements since they can be measured without direct interaction with the sample and from them the necessary information about the sample can be deduced.

By performing a hysteresis measurement comprising measurement of magnetisation as function of an external magnetic field of the catalysts which contains ferro-magnetic material inside the reactor, magnetic saturation, magnetic remnance and coercive field can be measured. These properties allow the calculation of other useful properties of the catalyst such as the amount of metal phase present (that is the degree of reduction) as well as sintering or crystallite break-up of ferro-magnetic and super-paramagnetic material. These measurements could also be used to determine crystallite sizes and crystallite size distributions of the magnetic matter in a sample.

Vibrating sample magnetometers are commercially available devices for characterisation of magnetic material. In these, a sample is secured in a holder which is either oscillated within a magnetic field and associated signal pickup coils or the magnetic field or signal pickup coils oscillated with respect to it. Quartz is often used for the sample holder as it is non-magnetic and thus does not affect the magnetic field or the disturbances created by the sample moving therein.

Experimental devices have also been proposed which include a tubular quartz reactor in which a sample is secured. These magnetometers usually offer the possibility to record magnetic properties of such material at different temperatures. However no measurements at controlled environments and elevated pressure are possible on these devices. In this context, elevated pressures are those above about 5 bar.

No devices are available which have the capability of characterising ferro- and super-paramagnetic material (including catalysts) at controlled gas environment at flow conditions at elevated pressures, that is at industrially fully relevant conditions in, for example, catalytic applications. Under such conditions, however, the characterisation of the magnetic catalyst behaviour can give important information on effects of catalyst oxidation and or reduction and or effects of catalyst sintering. This information helps to understand effects of catalyst deactivation and is of crucial importance for the development of improved catalysts.

SUMMARY OF THE INVENTION

In accordance with this invention there is provided a magnetometer which includes an elongate reactor, in which a sample can be secured in a sample support zone, located within a magnetic field space of a magnetic field generator and one or more signal pickup coils; and movement generating means for generating relative movement in a generally linear direction between the reactor and at least one of the magnetic field and pickup coil, characterised in that the reactor is a metal tube capable of operating at pressure greater than 5 bar and having a length which permits its ends to remain external of the signal pickup device during the relative movement.

Further features of the invention provide for movement to be in the general direction of the length of the reactor; for a heat source to be provided externally of the reactor; for the heat source to be static with respect to the pickup coil; for a temperature sensor made of a non-magnetic material to be located centrally within the sample; and for the sample to be secured between non-magnetic material, preferably a brass frit support and a glass wool cover.

Yet further features of the invention provide for the reactor to be movable in the magnetic field; for the reactor to be oscillated at a frequency of about 2 Hz; for four pickup coils to be provided, preferably connected in series; and for means for cooling the reactor to be provided.

DETAILED DESCRIPTION

Figure 1:
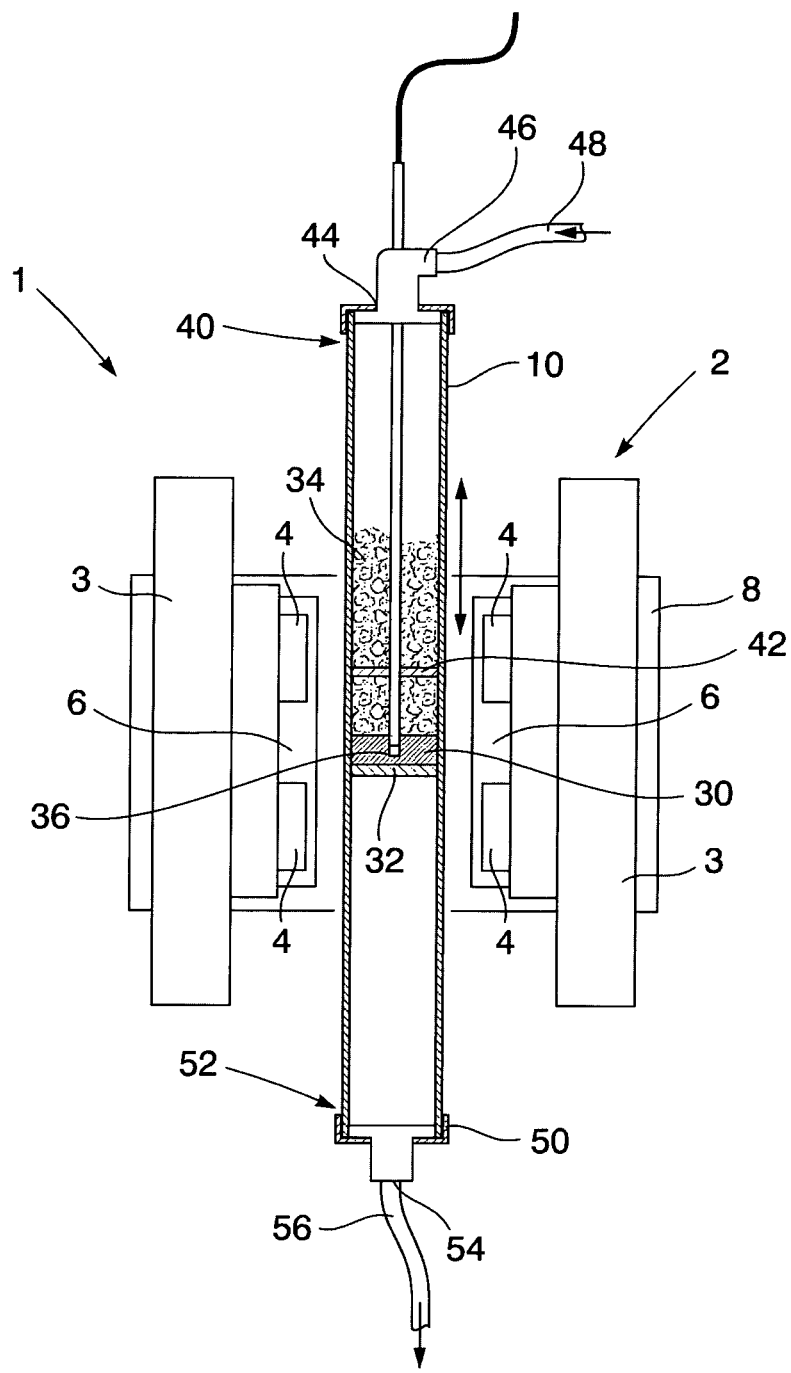
FIG. 1 is schematic part-sectional front elevation of a magnetometer.
Figure 2:
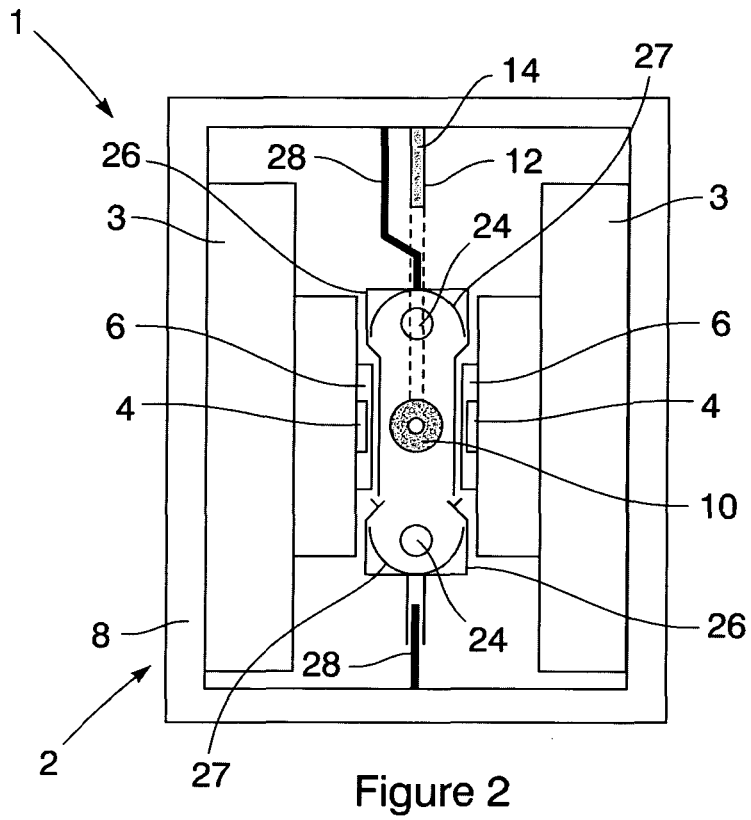
FIG. 2 is schematic part-sectional top plan view of the magnetometer in FIG. 1; and, FIG. 3 is schematic part-sectional side elevation of the magnetometer in FIG. 1.
Figure 3:
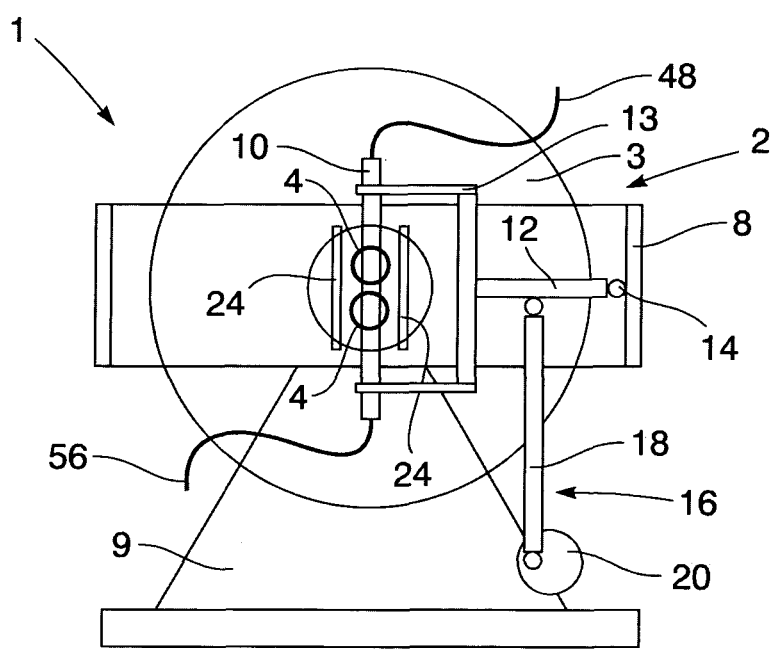

A magnetometer (1) is shown in FIGS. 1 to 3 and includes an electromagnet (2), which includes a pair of spaced apart, field-controlled electromagnet coils (3), which can be operated to produce a homogenous field of between −2T and +2T. A pair of signal pickup coils (4) is located centrally on the adjacent surfaces of the pole cap of each electromagnet coil (3), one above the other, with a cooling jacket (6) provided over each pair of pickup coils (4).

The electromagnet (2) further includes a rectangular frame (8) which extends centrally about the electromagnet coils (3) in a substantially horizontal fashion and is in turn supported on a pair of legs (9).

The pickup coils (4) are connected in series to a processor (not shown) which includes an amplifier and signal filter. The processor records the signal from the pickup coils (4) and also controls the operation of the electromagnet (2) and the reactor movement.

According to the invention, a reactor (10), in this embodiment a stainless steel tube having a 12.7 mm (half inch) external diameter extends centrally between the signal pickup coils (4) in an upright fashion. For reasons which are apparent below, either end of the reactor (10) extends about 10 cm past the signal pickup coils (4).

An arm (12) is secured to the reactor (10) through a bifurcate clamp (13) and extends radially therefrom with the distal end (14) of the arm (12) hingedly secured to the frame (8). Both the arm (12) and clamp (13) are made from aluminium. A cam (16) acts on the arm (12) along its length to enable the reactor (10) to be oscillated in its longitudinal axis. In this embodiment, the cam is provided by an arm (18) eccentrically secured to a motor (20) and imparts movement of 4 cm amplitude to the reactor (10) at a frequency of 2 Hz.

A pair of elongate infra-red heaters (24) are located on diametrically opposite sides of the reactor (10), parallel therewith, between the electromagnet coils (3) and an aluminium shield (26) extends about the heaters (24) and reactor (10) between the pickup coils (4) to be I-shaped in plan view. The ends of the shield (26) are open and extend between the bifurcate arms of the clamp (13) to permit the reactor (10) to oscillate within it. An elongate, concave, gold-plated ceramic mirror (27) extends between each heater (24) and the shield (26) to reflect heat towards the reactor (10). To further enhance heat absorbance, the outer surface of the reactor (10) is painted with a heat resistant, black paint. The shield (26) is supported on arms (28) extending from opposite sides of the frame (8) and the heater (24), part of the shield (26) and mirror (27) opposite the arm (12) can be moved radially away from the reactor (10) to permit access thereto.

A sample (30), in this embodiment a catalyst, is secured centrally within the reactor (10) by non-ferromagnetic material. In this embodiment, the catalyst (30) is supported on a brass frit (32) with glass wool (34) placed on top of the catalyst (30). The sample can be present in a particle size range between 0 and 10 mm, but would typically be from 0.05 to 3 mm. The sample may be diluted with other material to minimise the amount of heat generated in exothermic catalytic reactions conducted in the reactor. Gas and or liquid flow is preferably applied in a downward direction.

A temperature probe (36), in this embodiment a non-ferromagnetic Pt100 sensor in a brass sheath extends from the top (40) of the reactor into the centre of the catalyst (30). A non-ferromagnetic ring (42) having spokes extending radially therefrom is spaced apart from the brass frit and (32) assists in centering the probe (36) within the reactor (10). A fitting (44) at the top of the reactor permits the end of the probe (36) to extend therethrough for connection to the processor and also has a port (46) from which a flexible feed line (48) connected to a supply of gas (not shown) extends. A fitting (50) is similarly provided over the lower end (52) of the reactor (10) and provides an outlet port (54) with a flexible exit line (56) extending therefrom connected to analytical equipment (not shown). Both the feed (48) and exit (56) lines can be heated. This permits the feed of, for example, water vapour.

In use, the heaters (24) are operated to heat the reactor (10) and catalyst (30) to the desired temperature, typically up to 500° C. Hereafter, gas or liquid flow is applied through the catalyst (30) with gases, including most permanent gases (hydrogen, carbon monoxide, carbon dioxide, argon, nitrogen and helium) but also including water vapour, ammonia, hydrogen sulphide and others. Most importantly, the gases and liquids can be applied at elevated pressures exceeding 50 bar. Thus, actual operating conditions of the catalyst (30) can be created.

To study the catalyst (30) the motor (20) is operated to cause oscillation of the reactor (10) in its length between the pickup coils (4) within the field generated by the electromagnet (2). The signals from the pickup coils (4) are then analyzed in known fashion, where the saturation magnetisation corresponds to the amount of ferromagnetic material in the sample, and the remnant magnetisation relative to the saturation magnetisation multiplied by 200 ($\gamma=200*M_{rem}/M_{sat}$) corresponds to the percentage of large crystallites in a sample which do not exhibit super-paramagnetic behaviour. In addition, size distributions can be obtained from the magnetisation curves via fitting ideal magnetisation curves for nano-sized crystallites as described by Langevin equations and from $\gamma$ as measured at different temperatures (Weil or remanence method).

Whilst permitting reactions to occur at elevated pressures, the use of a stainless steel reactor is counter-intuitive in a magnetometer as it is magnetic. It is thus to be expected that movement of the reactor within the field will saturate the signal and mask that produced by the movement of the catalyst (30). However, by making the reactor (10) long enough so that its ends (40, 52) do not move between the pickup coils (4) during oscillation thereof, it does not create a significant difference in the signal produced by the catalyst. In fact, it is found to produce a signal of approximately 0.5% of what a typical catalyst produces and can thus be effectively dealt with.

The magnetometer is highly effective and provides great advantages over prior art devices in that it now permits the stability or property changes of ferro-magnetic and super-paramagnetic material to be studied at different gas environments, temperatures and pressures. Catalysts can thus be studied at fully relevant industrial conditions and this assists in optimizing catalyst design and development.

It is also possible to cool the reactor, including to subambient temperatures, for example using liquid nitrogen or helium circulating in a jacket around the reactor. This is particularly useful as much information can be obtained by characterising material at low temperature.

It will be appreciated, however, that many other embodiments of a magnetometer exist which fall within the scope of the invention particularly as regards the configuration thereof. For example, any suitable magnets and pickup devices can be used. The reactor can be made of any suitable material, but if ferromagnetic material is used its ends must not pass between the pickups during oscillation thereof. Also, it is preferred that the sample be heated externally and thus the material selected for the reactor should have good heat conductivity. The reactor could also be coated with any suitable material to enhance heat transfer.

Any suitable means of heating or cooling the reactor can be used, including, for example, an oil filled jacket, provided that the heating means does not include any ferrous material which oscillates between the signal pickup device. Clearly, the reactor can be operated at any suitable temperature and pressure and will be designed for the conditions desired.

Furthermore, if desired, the reactor can be held stationary and either or both of the pickup coils and electromagnets moved with respect thereto. Any suitable frequency and amplitude of movement can be applied to the reactor and this can be achieved in any suitable fashion.

If desired, the reactor can be coaxial with the electromagnets and relative movement also be along its length.

Also, any suitable sample can be used and it can be secured within the reactor on any suitable material which does not contain any ferro-magnetic material.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A magnetometer comprising: an elongate reactor, in which a sample can be secured in a sample support zone, located within a magnetic field space of a magnetic field generator, the reactor having ends; and a signal pickup coil; the reactor and at least one of the magnetic field and the pickup coil are mounted for relative oscillating movement in a generally linear direction, the reactor being a metal tube capable of operating at pressure greater than 5 bar and having a length which permits the ends to remain external of the signal pickup coil during the relative movement.

2. A magnetometer as claimed in claim 1 wherein movement is in the general direction of the length of the reactor.

3. A magnetometer as claimed in claim 1 wherein a heat source is provided externally of the reactor.

4. A magnetometer as claimed in claim 3 wherein the heat source is static with respect to the pickup coil.

5. A magnetometer as claimed in claim 1 wherein a temperature sensor made of a non-magnetic material is located centrally within the sample.

6. A magnetometer as claimed in claim 1 wherein the sample is secured between non-magnetic material.

7. A magnetometer as claimed in claim 1 wherein the reactor is movable in the magnetic field.

8. A magnetometer as claimed in claim 7 wherein the reactor is oscillated at a frequency of about 2 Hz.

9. A magnetometer as claimed in claim 1 wherein four pickup coils are provided.

10. A magnetometer as claimed in claim 9 wherein the pickup coils are connected in series.

11. A magnetometer as claimed in claim 1 further comprising a cooling device for the reactor.

* * * * *